(12) United States Patent
Park

(10) Patent No.: US 9,070,832 B2
(45) Date of Patent: Jun. 30, 2015

(54) LIGHT-EMITTING DEVICE AND FABRICATION METHOD THEREOF

(75) Inventor: KyungWook Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/175,552

(22) Filed: Jul. 1, 2011

(65) Prior Publication Data

US 2012/0001219 A1    Jan. 5, 2012

(30) Foreign Application Priority Data

Jul. 5, 2010    (KR) ........................ 10-2010-0064487

(51) Int. Cl.
  H01L 33/38    (2010.01)
  H01L 33/44    (2010.01)
  H01L 33/40    (2010.01)
  H01L 33/00    (2010.01)

(52) U.S. Cl.
  CPC ............. *H01L 33/38* (2013.01); *H01L 33/0079* (2013.01); *H01L 33/405* (2013.01); *H01L 33/44* (2013.01); *H01L 2924/0002* (2013.01); *H01L 2224/48091* (2013.01); *H01L 2224/48247* (2013.01)

(58) Field of Classification Search
  None
  See application file for complete search history.

(56) References Cited

U.S. PATENT DOCUMENTS

| | | | | |
|---|---|---|---|---|
| 6,674,097 | B2* | 1/2004 | Komoto et al. | 257/98 |
| 7,413,918 | B2* | 8/2008 | Tran et al. | 438/46 |
| 7,652,281 | B2* | 1/2010 | Takahashi et al. | 257/13 |
| 2005/0035364 | A1* | 2/2005 | Sano et al. | 257/99 |
| 2005/0121688 | A1* | 6/2005 | Nagai et al. | 257/99 |
| 2007/0114545 | A1* | 5/2007 | Jang et al. | 257/94 |
| 2008/0042161 | A1 | 2/2008 | Han et al. | |
| 2008/0157107 | A1 | 7/2008 | Shei et al. | 257/97 |
| 2008/0157109 | A1 | 7/2008 | Hon | 257/98 |
| 2009/0026490 | A1 | 1/2009 | Kim et al. | |

(Continued)

FOREIGN PATENT DOCUMENTS

| | | |
|---|---|---|
| CN | 1250546 A | 4/2000 |
| CN | 1433087 A | 7/2003 |

(Continued)

OTHER PUBLICATIONS

Korean Notice of Allowance dated Aug. 3, 2012 issued in Application No. 10-2010-0064487.

(Continued)

*Primary Examiner* — Johannes P Mondt
(74) *Attorney, Agent, or Firm* — KED & Associates LLP

(57) ABSTRACT

Disclosed is a light-emitting device including a conductive support substrate, a reflective layer arranged on the conductive support substrate, a first electrode layer arranged on the reflective layer and provided with a step in at least one region of the edge thereof, a protective layer arranged on the step, and a light-emitting structure arranged on the first electrode layer and the protective layer, the light-emitting structure including a first conductive semiconductor layer, a second conductive semiconductor layer and an active layer interposed between the first conductive semiconductor layer and the second conductive semiconductor layer, wherein at least one region of the reflective layer and the first electrode layer vertically overlaps the protective layer. Based on this configuration, the light-emitting device can exhibit improved adhesion between the electrode layer and the reflective layer and be provided with a wider reflective layer, thus improving brightness.

16 Claims, 11 Drawing Sheets

(56) References Cited

U.S. PATENT DOCUMENTS

2009/0278145 A1* 11/2009 Sakai .............................. 257/98
2010/0148202 A1    6/2010 Tomoda

FOREIGN PATENT DOCUMENTS

| | | |
|---|---|---|
| CN | 1613156 A | 5/2005 |
| CN | 101681959 A | 3/2010 |
| CN | 101740695 A | 6/2010 |
| EP | 1 956 663 A1 | 8/2008 |
| EP | 2 228 838 A1 | 9/2010 |
| EP | 2 333 852 A2 | 6/2011 |
| KR | 10-2009-0066185 A | 6/2009 |
| KR | 10-2010-0074352 A | 7/2010 |
| WO | WO 2009/002040 | 12/2008 |
| WO | WO 2009/117845 A1 | 10/2009 |

OTHER PUBLICATIONS

Euorpean Search Report for Application EP 11 17 2588 dated Feb. 4, 2015.

* cited by examiner

LIGHT-EMITTING DEVICE AND FABRICATION METHOD THEREOF

CROSS-REFERENCE TO RELATED APPLICATION

This application claims the priority benefit of Korean Patent Application No. 10-2010-0064487, filed on Jul. 5, 2010 in the Korean Intellectual Property Office, the disclosure of which is incorporated herein by reference.

BACKGROUND

1. Field

Embodiments relate to a light-emitting device and a fabrication method thereof.

2. Description of the Related Art

A light-emitting diode (LED) is a device which converts electric signals into light using characteristics of compound semiconductors. LEDs are now being applied to devices such as home appliances, remote controls, electronic signboards, displays, a variety of automatic appliances and the like and the application range thereof continues to expand.

Generally, a miniaturized LED is fabricated as a surface mount device such that it can be directly mounted to a printed circuit board (PCB). Accordingly, an LED lamp used as a display device is also developed in a surface mount device-type. Such a surface mount device may replace a conventional lamp and is used as lighting displays, character displays, image displays and the like, rendering various colors.

As the application range of LEDs widens, brightness required for lights in daily use and lights for structural signals increases. Accordingly, it is important to increase brightness of LEDs.

SUMMARY

Therefore, the embodiments provide a light-emitting device and a fabrication method thereof, to improve adhesion force between an electrode layer and a reflective layer, and enhance brightness through fabrication of a wider reflective layer.

In accordance with one aspect of the embodiment, provided is a light-emitting device including: a conductive support substrate; a reflective layer arranged on the conductive support substrate; a first electrode layer arranged on the reflective layer and provided with a step in at least one region of the edge thereof; a protective layer arranged on the step; and a light-emitting structure arranged on the first electrode layer and the protective layer, the light-emitting structure including a first conductive semiconductor layer, a second conductive semiconductor layer and an active layer interposed between the first conductive semiconductor layer and the second conductive semiconductor layer, wherein at least one region of the reflective layer and the first electrode layer vertically overlaps the protective layer.

The reflective layer and the first electrode layer may have an identical width.

A width of the region where the reflective layer and the first electrode layer vertically overlap the protective layer may be 15 to 30 μm.

A width of the region where the reflective layer and the first electrode layer overlap the protective layer may be 0.11- to 0.23-fold of the width of the protective layer.

The light-emitting device may further include a light extraction structure arranged on the light-emitting structure.

The light extraction structure may include a roughness having a predetermined roughness level.

The light-emitting device may further include an intermediate layer interposed between the first conductive semiconductor layer and the second conductive semiconductor layer, wherein the intermediate layer is an electron blocking layer.

The light-emitting device may further include a second electrode layer arranged on the light-emitting structure.

The light-emitting device may further include a current blocking layer arranged under the light-emitting structure such that the current blocking layer vertically overlaps the second electrode layer in at least one region.

The first electrode layer may include a step arranged in a region where the first electrode layer vertically overlaps the second electrode layer, wherein the current blocking layer is arranged in the step.

The light-emitting device may further include an insulating layer arranged at the side of the light-emitting structure.

The protective layer may include at least a first layer and a second layer arranged under the first layer.

The first layer contains silicon dioxide ($SiO_2$) and the second layer may contain aluminum oxide ($Al_2O_3$).

The reflective layer may contain at least one of Ag, Ni, Al, Rh, Pd, Ir, Ru, Mg, Zn, Pt, Au, Hf, IZO, IZTO, IAZO, IGZO, IGTO, AZO and ATO.

The area of the reflective layer may larger than the area of the active layer.

In accordance with another aspect, provided is a lighting system including the light-emitting device of the embodiments.

In accordance with another aspect, provided is a method for fabricating a light-emitting device including: forming a light-emitting structure on a growth substrate, the light-emitting structure including at least a first conductive semiconductor layer, an active layer and a second conductive semiconductor layer; forming a protective layer in at least one region of the edge of the light-emitting structure; and simultaneously baking the first electrode layer and the reflective layer arranged on the protective layer and the light-emitting structure.

The method may further include; simultaneously etching the edges of the first electrode layer and the reflective layer; forming a conductive support substrate on the reflective layer; removing the growth substrate; and etching at least one region of the edge of the light-emitting structure such that at least one region of the protective layer is etched.

The method may further include; forming roughness on the first conductive semiconductor layer; and forming a second electrode layer on the first conductive semiconductor layer.

The forming the protective layer may include: forming a first layer containing silicon dioxide ($SiO_2$); and forming a second layer containing aluminum oxide ($Al_2O_3$) on the first layer.

BRIEF DESCRIPTION OF THE DRAWINGS

The above and other features and other advantages of the embodiment will be more clearly understood from the following detailed description taken in conjunction with the accompanying drawings, in which.

DETAILED DESCRIPTION OF THE PREFERRED EMBODIMENTS

Figure 1:
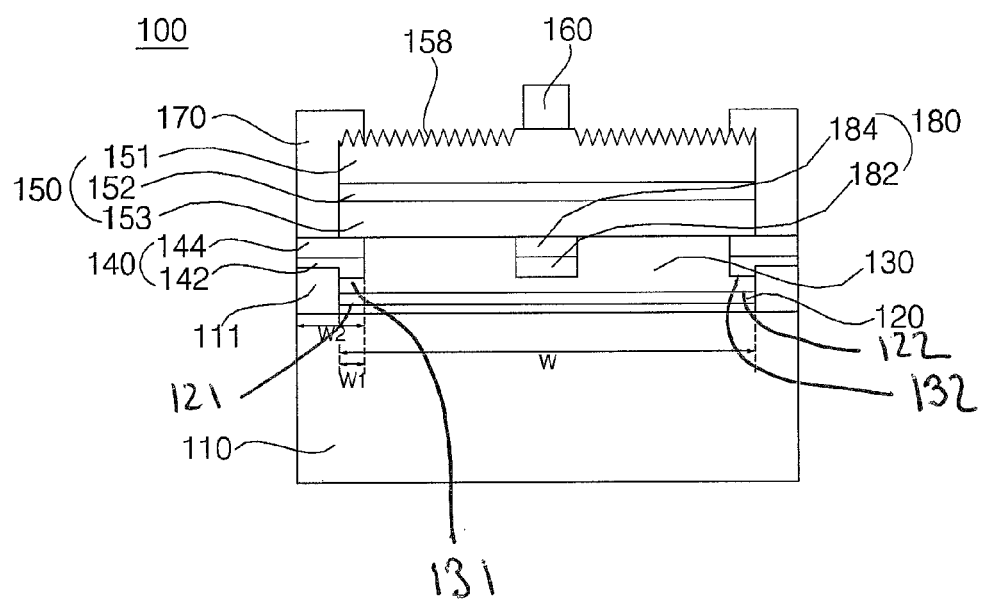
FIG. 1 is a sectional view illustrating the structure of a light-emitting device according to one embodiment.

Reference will now be made in detail to the embodiments, examples of which are illustrated in the accompanying drawings.

Advantages and characteristics of the embodiments and methods for addressing the same will be clearly understood from the following embodiments taken in conjunction with the annexed drawings. However, the embodiments are not limited to the embodiments and realized by various forms thereof. The embodiments are only provided to more completely illustrate the embodiments and the scope of the embodiments are defined by only claims. Accordingly, in some embodiments, well-known processes, well-known device structures and well-known techniques are not illustrated in detail to avoid unclear interpretation of the embodiments. The same reference numbers will be used throughout the specification to refer to the same or like parts.

Prior to description of the embodiments, it will be understood that, when an element is referred to as being formed "on or under" another element, the two elements may directly contact each other or may be indirectly arranged such that at least one intervening element is interposed therebetween. Further, the term "on or under" of an element may mean "on" as well as "under" the element.

Terms used in the specification are only provided to illustrate the embodiments and should not be construed as limiting the scope and spirit of the embodiments. In the specification, a singular form of terms includes plural forms thereof, unless specifically mentioned otherwise. In the term "comprises" and/or "comprising" as herein used, the mentioned component, step, operation and/or device is not excluded from presence or addition of one or more other component, steps, operations and/or devices.

Unless defined otherwise, all terms (including technical and scientific terms) used herein may be intended to have meanings understood by those skilled in the art. In addition, terms defined in general dictionaries should not be interpreted abnormally or exaggeratedly, unless clearly specifically defined.

In the drawings, the thicknesses or sizes of respective layers are exaggerated, omitted or schematically illustrated for clarity and convenience of description. Therefore, the sizes of respective elements do not wholly reflect actual sizes thereof.

Although terms such as first and second are used to illustrate a variety of elements, components, layers and/or regions, the terms should not be construed as limiting the elements, components, layers and/or regions.

In addition, angles and directions referred to during description of a structure of a light emitting device are described based on illustration in the drawings. In the description of the structure of the light emitting device, if reference points with respect to the angles and positional relations are not clearly stated, the related drawing will be referred to.

Reference will now be made in detail to the embodiments, examples of which are illustrated in the accompanying drawings.

FIG. 1 is a sectional view illustrating the structure of a light-emitting device according to one embodiment.

Referring to FIG. 1, the light-emitting device 100 according to this embodiment includes: a conductive support substrate 110; a reflective layer 120 arranged on the conductive support substrate 110; a first electrode layer 130 arranged on the reflective layer 120 and provided with a step in at least one region of the edge thereof; a protective layer 140 arranged on the step; and a light-emitting structure 150 arranged on the first electrode layer 130 and the protective layer 140, the light-emitting structure 150 including a first conductive semiconductor layer 151, a second conductive semiconductor layer 153 and an active layer 152 interposed between the first conductive semiconductor layer 151 and the second conductive semiconductor layer 153, wherein at least one region of the reflective layer 120 and the first electrode layer 130 vertically overlaps the protective layer 140 in at least one region. FIG. 1 shows at least one region 121 (or at least one first region) of the reflective layer 120, and at least one region 122 (or at least one first region) of the reflective layer 120.

The conductive support substrate 110 may be made of a thermally conductive material or a conductive material such as a metal or conductive ceramic. The conductive support substrate 110 may be a mono-layer, or a di- or multi-layer.

That is, the conductive support substrate 110 may be made of a metal selected from Au, Ni, W, Mo, Cu, Al, Ta, Ag, Pt and Cr, or an alloy thereof and may be a laminate including two or more different materials.

Such a conductive support substrate 110 facilitates emission of heat generated by the light-emitting device 100 and improves thermal stability of the light-emitting device 100.

In a case where a part of light generated in the active layer 152 of the light-emitting structure 150 is directed toward the conductive support substrate 110, the reflective layer 120 reflects the light toward the top of the light-emitting device 100, thus improving light extraction efficiency of the light-emitting device 100. Accordingly, the reflective layer 120 may be made of a material having a high light reflectance. For example, the reflective layer 120 is made of a metal selected from Ag, Ni, Al, Rh, Pd, Ir, Ru, Mg, Zn, Pt, Au, Hf and combinations thereof, or is a multi-layer composed of the metal and a light-transmitting conductive material such as IZO, IZTO, IAZO, IGZO, IGTO, AZO and ATO. In addition, the reflective layer 120 may be a laminate of IZO/Ni, AZO/Ag, IZO/Ag/Ni, AZO/Ag/Ni or the like.

The first electrode layer 130 may be have a multi-layer structure and for example, may include, without being limited to, an ohmic layer (not shown) and a bonding layer (not shown).

The ohmic layer (not shown) ohmic contacts the bottom of the light-emitting structure 150 and may include a plurality of layers or patterns. The ohmic layer (not shown) may be selected from light-transmitting electrode layers and metals. The ohmic layer may be realized as a mono- or multi-layer using one or more selected from indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni, Ag, Ni/IrOx/Au, and Ni/IrOx/Au/ITO. The ohmic layer (not shown) facilitates incorporation of carriers in the second semiconductor layer 153 and may be not formed in some cases.

In addition, the first electrode layer 130 may include a bonding layer (not shown) and the bonding layer (not shown) may contain, as a barrier metal or a bonding metal, at least one selected from Ti, Au, Sn, Ni, Cr, Ga, In, Bi, Cu, Ag and Ta, without being limited thereto.

Meanwhile, the reflective layer 120 and the first electrode layer 130 may have the same width (W) and may have superior adhesion force, since the reflective layer 120 and the first electrode layer 130 are formed through a simultaneous baking process.

The first electrode layer 130 may include a step 131 (also referred to as a first step) in least one region of the edge thereof and the protective layer 140 may be arranged on the step. When the reflective layer 120 and the first electrode layer 130 formed by simultaneous baking are etched, the protective layer 140 prevents the light-emitting structure 150 from being etched. At this time, the etching method may be, for example, dry etching. FIG. 1 also shows a step 132 (also referred to as a second step).

In addition, the protective layer 140 may have a multi-layer structure and may, for example, include a first layer 144 and a second layer 142 arranged thereon. The first layer 144 may contain silicon dioxide ($SiO_2$) and the second layer 142 may contain aluminum oxide ($Al_2O_3$), thus more efficiently protecting the light-emitting structure 150 against etching.

The protective layer 140 may be arranged such that it vertically partially overlaps the first electrode layer 130 and the reflective layer 120.

As mentioned below, after the first electrode layer 130 and the reflective layer 120 undergo simultaneous baking and single etching, the reflective layer 120 is arranged such that it vertically partially overlaps the protective layer 140 and has a wider area. This maximizes reflectivity of the reflective layer 120 and improves the luminous efficiency of the light-emitting diode 100. In addition, when the first electrode layer 130 and the reflective layer 120 undergo simultaneous baking and single etching processes, the reflective layer 120 and the first electrode layer 130 may have the same width (W).

Meanwhile, the width $W_1$ of the region in which the reflective layer 120 and the first electrode layer 130 vertically partially overlap the protective layer 140 may be 15 to 30 µm. Taking into consideration the fact that the protective layer 140 has a width $W_2$ of about 130 µm, the width $W_1$ of the region in which the reflective layer 120 and the first electrode layer 130 vertically partially overlap the protective layer may be 0.11- to 0.23-fold of the width $W_2$ of the protective layer 140.

The light-emitting structure 150 contacts the first electrode layer 130 and the protective layer 140 and may include at least the first conductive semiconductor layer 151, the active layer 152 and the second conductive semiconductor layer 153, and the active layer 152 may be interposed between the first conductive semiconductor layer 151 and the second conductive semiconductor layer 153. In addition, the light-emitting structure 150 may further include a light extraction structure 158 and a second electrode layer 160 arranged on the light-emitting structure 150.

The first semiconductor layer 151 may be realized by an n-type semiconductor layer and may supply electrons to the active layer 152. The first semiconductor layer 151 may be selected from semiconductor materials having a formula of $In_xAl_yGa_{1-x-y}N$ ($0 \leq x \leq 1$, $0 \leq y \leq 1$, $0 \leq x+y \leq 1$), such as GaN, AlN, AlGaN, InGaN, InN, InAlGaN and AlInN and may be doped with an n-type dopant such as Si, Ge and Sn.

The active layer 152 may be arranged under the first conductive semiconductor layer 151.

The active layer 152 may have a single or multi-quantum well structure, a quantum wire structure, a quantum dot structure or the like made of a compound semiconductor material composed of Group III-V elements.

In the case where the active layer 152 has a quantum well structure, for example, it may have a single or multi-quantum well structure including a well layer having the formula of $In_xAl_yGa_{1-x-y}N$ ($0 \leq x \leq 1$, $0 \leq y \leq 1$, $0 \leq x+y \leq 1$) and a barrier layer having the formula of $In_aAl_bGa_{1-a-b}N$ ($0 \leq x \leq 1$, $0 \leq y \leq 1$, $0 \leq x+y \leq 1$). The well layer may be made of a material having a band gap smaller than that of the barrier layer.

The second conductive semiconductor layer 153 may be realized by a p-type semiconductor layer to supply holes to the active layer 152. The second conductive semiconductor layer 153 may for example be made of a semiconductor material having a formula of $In_xAl_yGa_{1-x-y}N$ ($0 \leq x \leq 1$, $0 \leq y \leq 1$, $0 \leq x+y \leq 1$) such as GaN, AlN, AlGaN, InGaN, InN, InAlGaN and AlInN and may be doped with a p-type dopant such as Mg, Zn, Ca, Sr and Ba.

Meanwhile, the first conductive semiconductor layer 151, the active layer 152 and the second conductive semiconductor layer 153 may be formed by a method which includes, but is not limited to, metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE) and sputtering.

Meanwhile, an intermediate layer (not shown) may be arranged between the first conductive semiconductor layer 151 and the second conductive semiconductor layer 153, the intermediate layer (not shown) may be an electron blocking layer which prevents a phenomenon in which electrons supplied from the first conductive semiconductor layer 151 to the active layer 152 are not recombined in the active layer 152 and instead are supplied to the second conductive semiconductor layer 153, when high current is applied thereto. The intermediate layer (not shown) has a larger band gap than the active layer 152, thus preventing the phenomenon in which electrons supplied from the first conductive semiconductor layer 151 to the active layer 152 are not recombined in the active layer 152 and instead are supplied to the second conductive semiconductor layer 153. Accordingly, this increases the possibility of recombination between electrons and holes in the active layer 152 and prevents current leakage.

Meanwhile, the intermediate layer (not shown) may have a band gap larger than the barrier layer included in the active layer 152 and may for example be made of a p-type Al-containing semiconductor layer such as AlGaN, without being limited thereto.

Meanwhile, the light-emitting structure 150 may include a third semiconductor layer (not shown) having polarity opposite to the first conductive semiconductor layer 151, arranged on the first conductive semiconductor layer 151. In addition, the first conductive semiconductor layer 151 may be realized by a p-type semiconductor layer and the second conductive semiconductor layer 153 may be realized by an n-type semiconductor layer. As a result, the light-emitting device 150 may have at least one of n-p, p-n, n-p-n and p-n-p junction structures.

Meanwhile, the second electrode layer 160 may be arranged on the first conductive semiconductor layer 151 such that it is electrically connected to the first conductive semiconductor layer 151, and the second electrode layer 160 may include an electrode having at least one pad and/or predetermined pattern. The second electrode layer 160 may be arranged in a center, peripheral or edge region on the first conductive semiconductor layer 151 and the region is not limited thereto. Meanwhile, the second electrode layer 160 may be arranged in a region other than regions provided on the first conductive semiconductor layer 151 and the position thereof is not limited thereto.

The second electrode layer 160 may be a mono- or multi-layer made of a conductive material such as a metal selected from In, Co, Si, Ge, Au, Pd, Pt, Ru, Re, Mg, Zn, Hf, Ta, Rh, Ir, W, Ti, Ag, Cr, Mo, Nb, Al, Ni, Cu, and WTi, or an alloy thereof.

The light-emitting structure 150 may further be provided at the top thereof with a light extraction structure 158. The light extraction structure 158 may be arranged in partial regions or over the entirety of the first conductive semiconductor layer 151. The light extraction structure 158 may be formed by etching at least one region of the upper surface of the first conductive semiconductor layer 151 and the formation method is not limited thereto. The etching process includes a wet or/and dry etching process. After the etching process, the upper surface of a light-transmitting electrode layer (not shown) or the supper surface of the first conductive semiconductor layer 151 may have roughness which constitutes the light extraction structure 158. The roughness having a random size may be irregularly formed, but is not limited thereto. The roughness includes at least one of a texture pattern, a concave-convex pattern and an uneven pattern.

The cross-section of the roughness may have various shapes, such as a cylinder, a polyprism, a cone, a polypyramid, a circular truncated cone and a frustum of a pyramid, and preferably has a conical or polypyramidal shape.

Meanwhile, the light extraction structure 158 may be formed by a photo-electro chemical (PEC) method, but formation of the light extraction structure 158 is not limited thereto. When the light extraction structure 158 is formed on the upper surface of the light-transmitting electrode layer 151, re-absorption of light generated from the active layer 152 into the active layer 152 or scattering of the light due to total reflection of the light by the upper surface of the light-transmitting electrode layer (not shown) or the first semiconductor layer 151 is prevented, thereby contributing to improvement of light extraction efficiency of the light-emitting device 100.

A current blocking layer 180 may be arranged under the light-emitting structure 150 such that the current blocking layer 180 vertically overlaps the second electrode layer 160 in at least one region. In addition, the first electrode layer 130 may provided with a step in which the current blocking layer 180 is arranged.

In a case where the first semiconductor layer 151 is realized by an n-type semiconductor layer, the current blocking layer 180 prevents current crowding in which electrons supplied through the second electrode layer 160 are concentrated at only the bottom of the second electrode layer 160.

The current blocking layer 180 may be formed simultaneously with the protective layer 140 as mentioned below and may be composed of a first layer 184 containing silicon dioxide ($SiO_2$) or a second layer 182 containing aluminum oxide ($Al_2O_3$), similar to the protective layer 140.

The light-emitting device 100 may include an insulating layer 170 arranged at the side of the light-emitting structure 150. The insulating layer 170 may be made of an insulating material such as silicon oxide ($SiO_2$) or silicon nitride ($Si_3N_4$) and may extend from the top of the protective layer 140, which does not vertically overlap the light-emitting structure 150 along the side of the light-emitting structure 150 to the partial top of the first semiconductor layer 151.

FIGS. 2 to 9 are sectional views illustrating a method for fabricating the light-emitting device.

Figure 2:
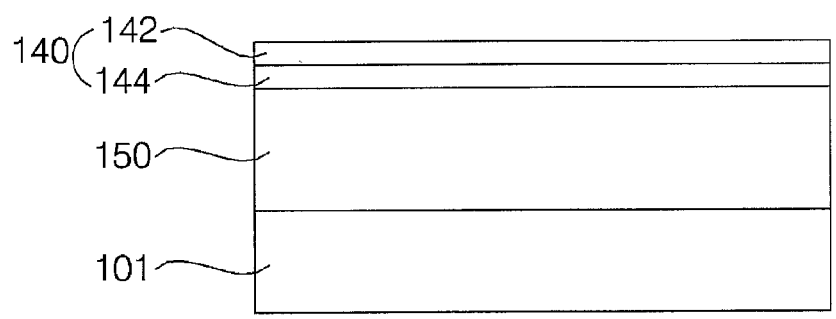
FIGS. 2 to 9 are sectional views illustrating a method for fabricating the light-emitting device of FIG. 1.

Referring to FIG. 2, a light-emitting structure 150 is formed on a growth substrate 101.

The growth substrate 101 is selected from the group consisting of sapphire ($Al_2O_3$) GaN, SiC, ZnO, Si, GaP, InP and GaAs. Although not illustrated in the drawings, a buffer layer (not shown) may be formed between the growth substrate 101 and the light-emitting structure 150.

The buffer layer (not shown) may be made of a compound of Group III and V elements, but may be selected from GaN, InN, AlN, InGaN, AlGaN, InAlGaN and AlInN and may be doped with a dopant.

An undoped semiconductor (not shown) may be arranged on the growth substrate 101 or the buffer layer (not shown), at least one of the buffer layer (not shown) and undoped semiconductor layer (not shown) may be formed or be not formed, and this structure is not limited.

The light-emitting structure 150 may include at least the first conductive semiconductor layer, the active layer and the second conductive semiconductor layer, and this structure is defined above and a detailed explanation thereof is thus omitted.

The first layer 144 and the second layer 142 to form the protective layer 140 and the current blocking layer 180, respectively, may be sequentially formed in separate regions on the light-emitting structure 150 by a method such as sputtering.

The first layer 144 may contain silicon dioxide ($SiO_2$) and the second layer 142 may contain aluminum oxide ($Al_2O_3$).

Figure 3:
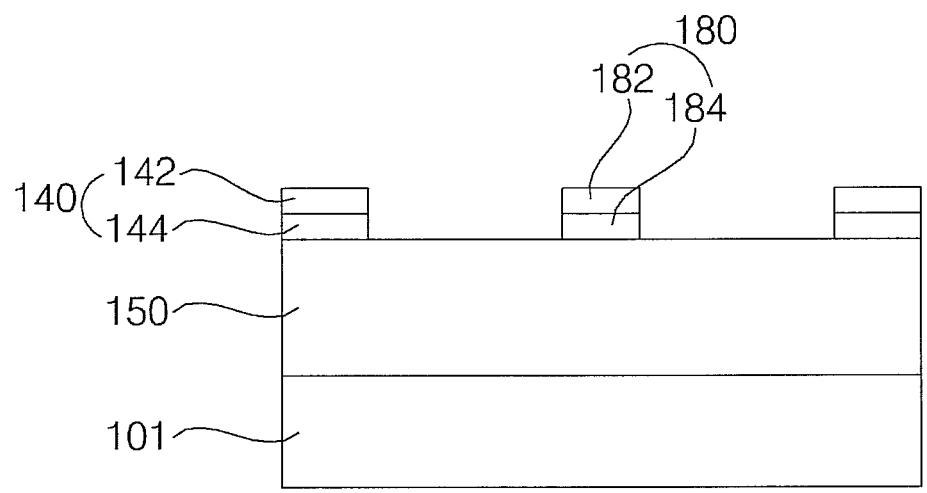

As shown in FIG. 3, the first layer 144 and the second layer 142 are patterned using (not shown) a mask provided with an opening in regions where the protective layer 140 and the current blocking layer 180 are to be formed, and then baked at 600° C. or more to form the protective layer 140 and the current blocking layer 180.

Figure 4:
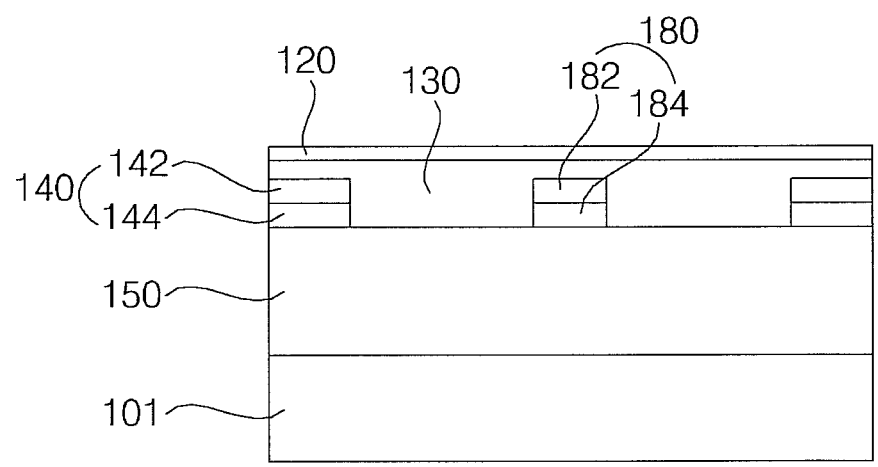

In FIG. 4, the first electrode layer 130 and the reflective layer 120 are simultaneously formed. That is, the formation of the first electrode layer 130 and the reflective layer 120 may be carried out by sequentially forming these layers by a method such as sputtering, followed by simultaneously baking. When the first electrode layer 130 and the reflective layer 120 are formed by simultaneous baking as mentioned above, adhesion between the first electrode layer 130 and the reflective layer 120 may be improved.

Figure 5:
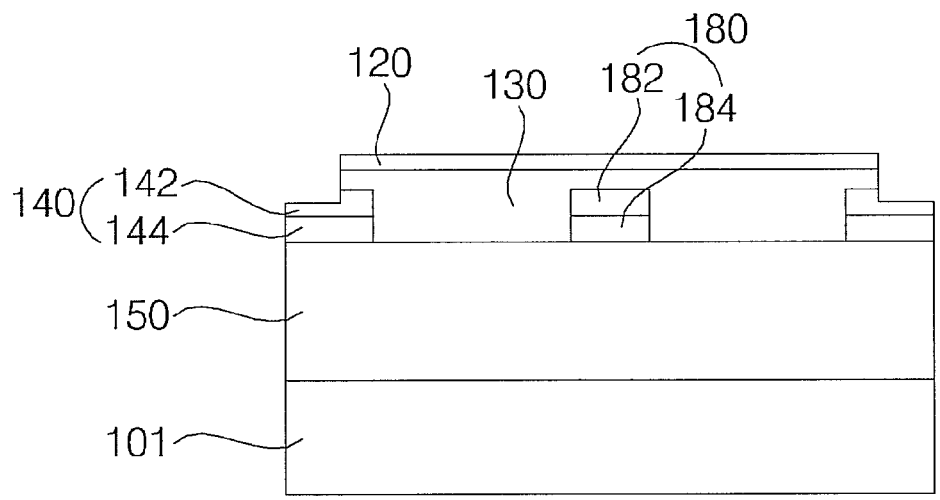

Referring to FIG. 5, peripheral regions of the first electrode layer 130 and the reflective layer 120 are mesa-etched. The mesa etching may be carried out by dry etching. At this time, since the first electrode layer 130 and the reflective layer 120 are simultaneously etched, the first electrode layer 130 and the reflective layer 120 may have the same width (W).

Accordingly, the reflective layer 120 may have a wider area, thus exhibiting maximum reflection properties and improving luminous efficiency of the light-emitting diode 100.

In addition, after the first electrode layer 130 and the reflective layer 120 are mesa-etched, the reflective layer 120 vertically partially overlaps the protective layer 140 and the width $W_1$ of the region where the reflective layer 120 vertically partially overlaps the protective layer 140 may be 15 to 30 μm. At this time, taking into consideration the fact that the width $W_2$ of the protective layer 140 is about 130 μm, the width $W_1$ of region where the reflective layer 120 vertically partially overlaps the protective layer 140 may be 0.11- to 0.23-fold of the width $W_2$ of the protective layer 140.

The protective layer 140 prevents the light-emitting structure 150 from being etched, when the reflective layer 120 and the first electrode layer 130 are dry-etched.

Figure 6:
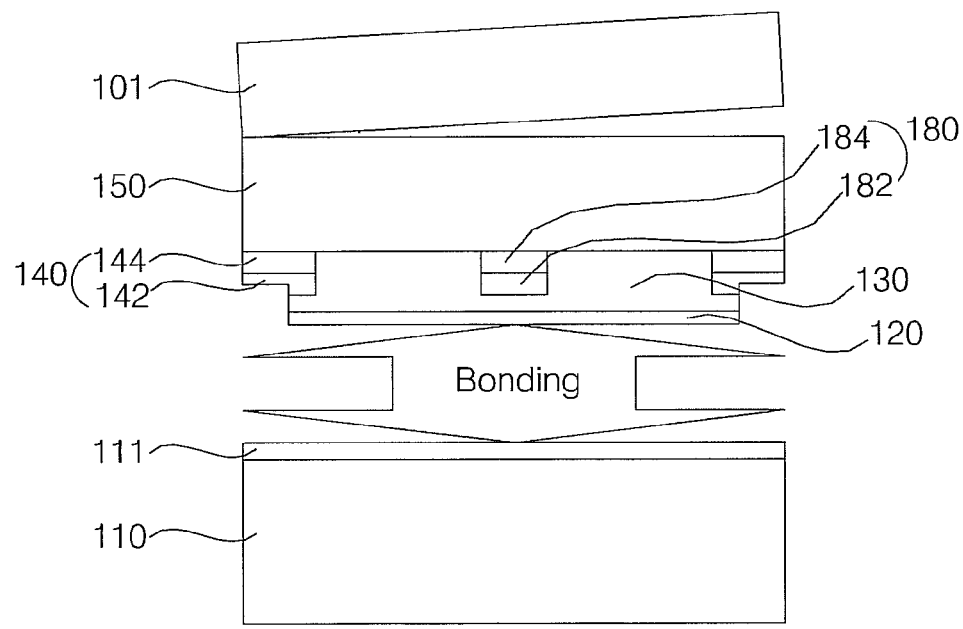

Referring to FIG. 6, a conductive support member or a conductive support substrate 110 may be arranged on the reflective layer 120. The conductive support substrate 110 may be adhered to the reflective layer 120 by an adhesion layer 111.

In a case where the conductive support substrate 110 is arranged, the conductive support substrate 110 is positioned in the base and the growth substrate 101 is then removed. The growth substrate 101 may be removed by a physical and/or chemical method and one example of the physical method is a laser lift off (LLO) manner.

Meanwhile, although not shown, after removal of the growth substrate 101, the buffer layer (not shown) arranged on the light-emitting structure 150 may be removed. At this time, the buffer layer (not shown) may be removed by a dry- or wet-etching method, or a polishing process.

Figure 7:
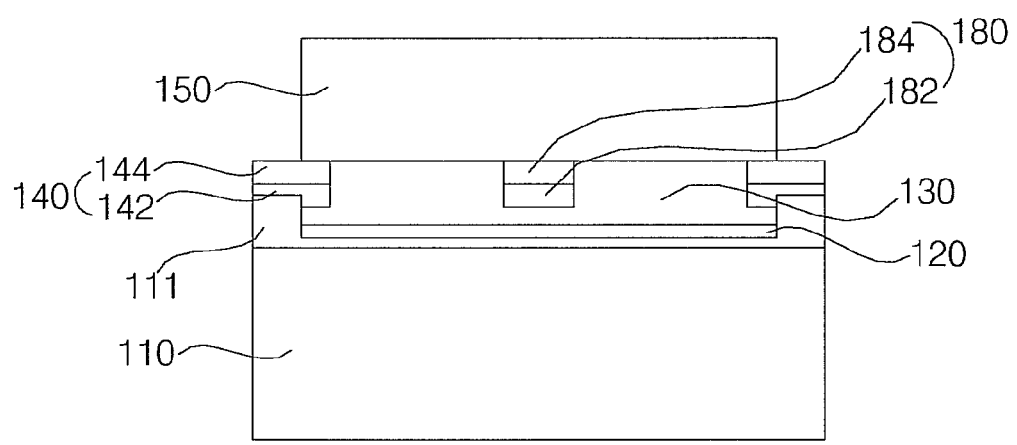
Figure 8:
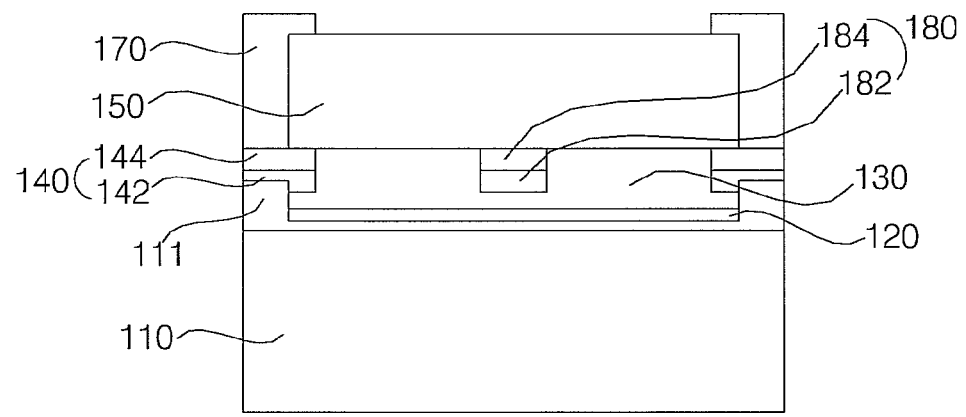

Referring to FIGS. 7 and 8, the peripheral regions of the light-emitting structure 150 are mesa-etched and an insulating layer 170 is then arranged. By mesa-etching the light-emitting structure 150, the width of the active layer 152 may be larger than that of the reflective layer 120 and an area of the reflective layer 120 is larger than that of the active layer 152, thus further improving reflectivity of the reflective layer 120.

The insulating layer 170 may be made of an insulating material and may extend from the top of the protective layer 140, which does not vertically overlap the light-emitting structure 150 along the side of the light-emitting structure 150 to the partial top of the first semiconductor layer 151.

Figure 9:
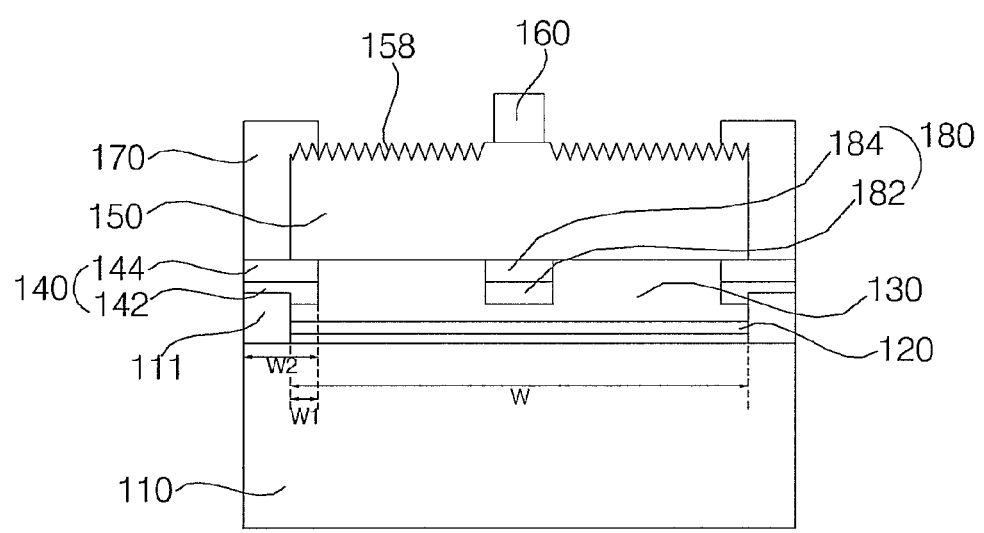

Referring to FIG. 9, the surface of the first conductive semiconductor layer 151 is partially or entirely etched by a predetermined etching method to form a light extraction structure 158 and a second electrode layer 160 on the first conductive semiconductor layer 151.

The light extraction structure 158 may be not formed in some cases and the structure thereof is not limited to that illustrated in FIG. 9.

Meanwhile, the second electrode layer 160 vertically overlaps the current blocking layer 180 in at least one region. That is, the current blocking layer 180 is arranged such that it corresponds to the position of the second electrode layer 160, thus preventing electron crowding in which electrons supplied through the second electrode layer 160 are concentrated on only the bottom of the second electrode layer 160.

Figure 10A:
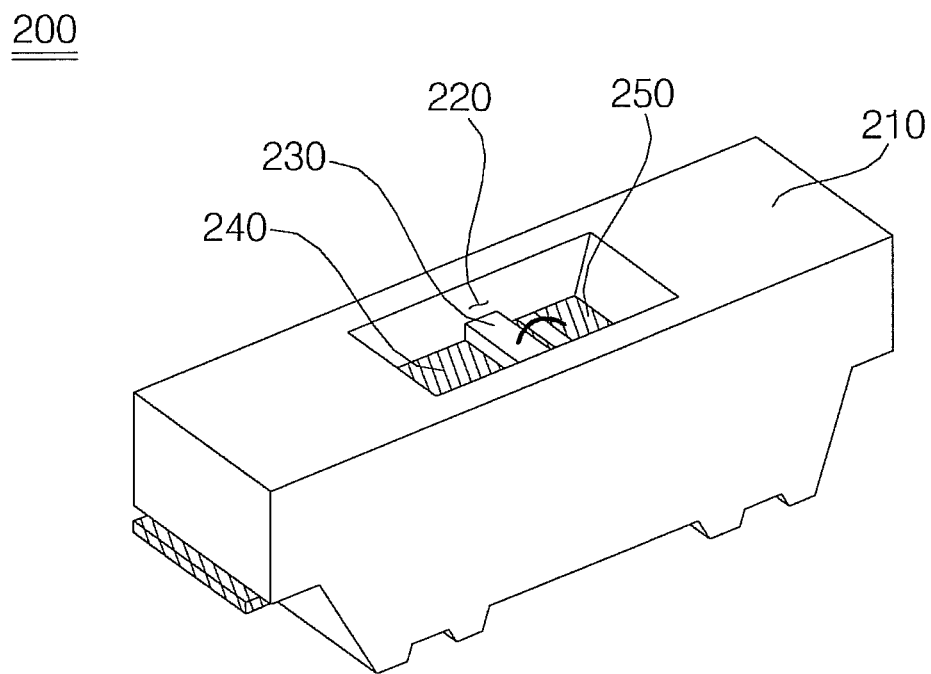
FIG. 10A is a perspective view illustrating a lighting device including a light-emitting device package according to one embodiment.

FIG. 10A is a perspective view illustrating a light-emitting device package according to one embodiment. FIG. 11B is a sectional view of the light-emitting device package illustrated in FIG. 10A.

Figure 10B:
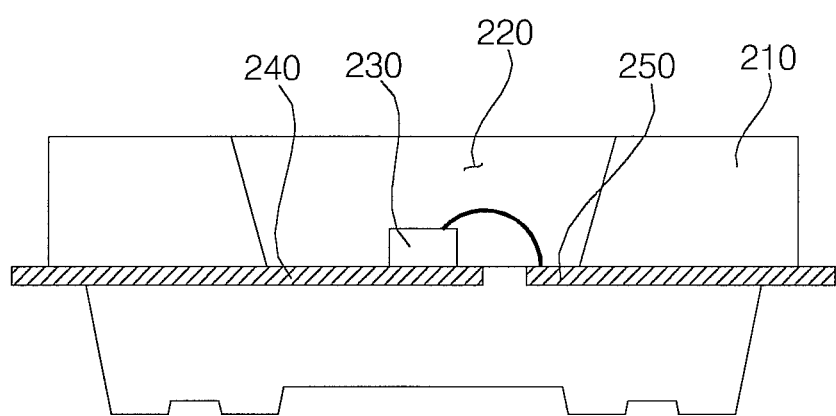
FIG. 10B is a sectional view of the light-emitting device package illustrated in FIG. 10A.

Referring to FIGS. 10A and 10B, the light-emitting device package 200 according to the embodiment includes a body 210 having a cavity 220, first and second lead frames 240 and 250 mounted in the body 210, and a light-emitting device 230 electrically connected to the first and second lead frames 240 and 250.

The body 21 may be made of at least one selected from resins such as polyphthalamide (PPA), silicon (Si), aluminum (Al), aluminum nitride (AlN), aluminum oxide (AlOx), photosensitive glass (PSG), polyamide 9T (PA9T), syndiotactic polystyrene (SPS), a metal, sapphire ($Al_2O_3$), beryllium oxide (BeO), ceramic, a printed circuit board (PCB) and ceramic. The body 210 may be formed by injection molding, etching and the like and the present embodiments is not limited to this formation method.

The inner surface of the body 210 may be provided with an inclined surface. The reflective angle of light emitted from the light-emitting device 230 may be varied, depending on the angle of the inclined surface. Accordingly, the orientation angle of light discharged to the outside can be controlled.

Meanwhile, as seen from the top, the cavity provided in the body 210 may have various shapes including, without being limited to, a circular shape, a rectangular shape, a polygonal shape, an oval shape and a shape with curved corners.

A resin layer may be formed in the cavity and the resin layer may include a phosphor (not shown). The resin layer may be made of transparent silicone, epoxy and other resins and may be formed by filling the cavity with a resin, followed by curing using UV or heat.

The phosphor (not shown) is selected, taking into consideration the wavelength of light emitted from the light-emitting device 230 to allow the light-emitting device package 200 to render white light.

The phosphor included in the resin layer may be at least one of blue light-emitting phosphors, blue-green light-emitting phosphors, green light-emitting phosphors, yellow-green light-emitting phosphors, yellow light-emitting phosphors, yellow-red light-emitting phosphors, orange light-emitting phosphors, and red light-emitting phosphors.

That is, the phosphor (now shown) is excited by first light emitted from the light-emitting device 230 to produce second light. For example, in a case where the light-emitting device 230 is a blue light-emitting diode and the phosphor (not shown) is a yellow phosphor, the yellow phosphor is excited by blue light to emit yellow light, blue light emitted from the blue light-emitting diode is mixed with yellow light excited and generated by blue light to allow the light-emitting device package 200 to render white light.

Similarly, in the case where the light-emitting device 230 is a green light-emitting diode, a magenta phosphor or a combination of blue and red phosphors may be exemplified, and in the case where the light-emitting device 230 is a red light-emitting diode, a cyan phosphor or a combination of blue and green phosphors may be exemplified.

Such a phosphor may be a known phosphor such as YAG, TAG, sulfides, silicates, aluminates, nitrides, carbides, nitridosililcates, borates, fluorides and phosphates.

Meanwhile, the body 210 may be provided with the first lead frame 240 and the second lead frame 250. The first lead frame 240 and the second lead frame 250 are electrically connected to the light-emitting device 230 to supply electricity to the light-emitting device 230.

The first lead frame 240 and the second lead frame 250 are electrically separated from each other, to reflect light emitted from the light-emitting device 230 and thereby improve light efficiency and discharge heat emitted from the light-emitting device 230 to the outside.

FIGS. 10A and 10B illustrate a case in which the light-emitting device 230 is provided on the first lead frame 250, although the present embodiments is not limited to this configuration. The light-emitting device 230 may be electrically connected to the first lead frame 240 and second lead frame 250 by wire bonding, flip chip or die bonding.

The first lead frame 240 and second lead frame 250 may contain a metal such as titanium (Ti), copper (Cu), nickel (Ni), gold (Au), chrome (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru), iron (Fe), and an alloy thereof. In addition, the first and second lead frames 240 and 250 may have a monolayer or multilayer structure, without being limited thereto.

Figure 11A:
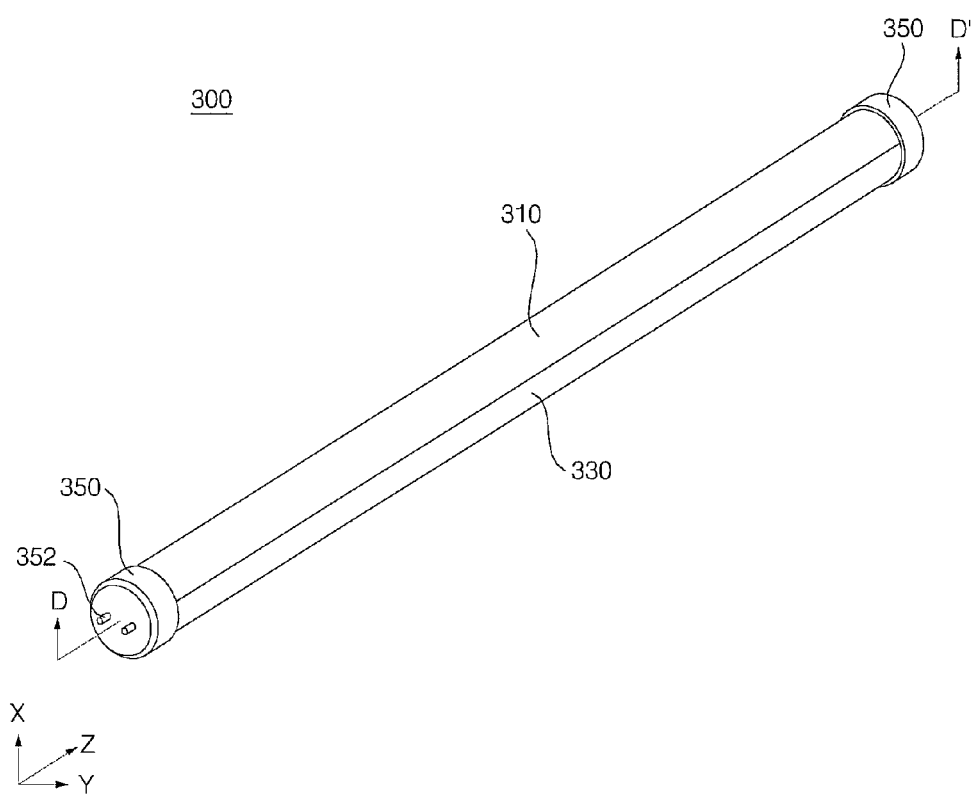
FIG. 11A is a perspective view illustrating a lighting device including a light-emitting device according to one embodiment.
Figure 11B:
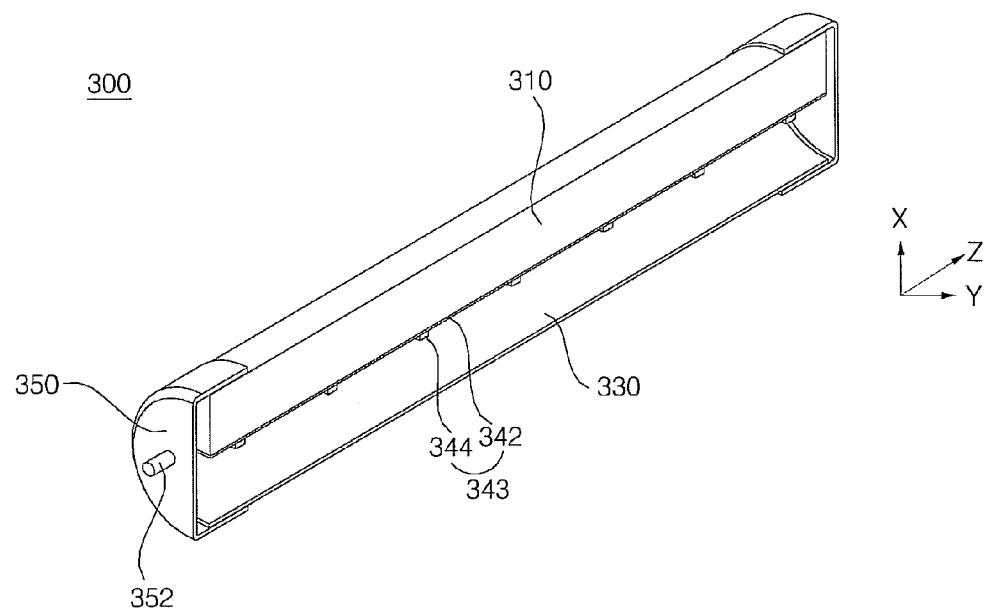
FIG. 11B is a sectional view of the lighting device taken along the line A-A of FIG. 1.

FIG. 11A is a perspective view illustrating a lighting device including a light-emitting device according to one embodiment. FIG. 11B is a sectional view of the lighting device taken along the line A-A of FIG. 1.

Meanwhile, hereinafter, for better understanding, the lighting device 300 will be described based on a longitudinal direction Z, a horizontal direction Y vertical to the longitudinal direction Z, and a height direction Z vertical to the longitudinal direction Z and the horizontal direction Y.

That is, FIG. 11B is a sectional view of the lighting device 300 of FIG. 11A, taken along the cross-section of the longitudinal direction (Z) and height direction (X) and seen from the horizontal direction (Y).

Referring to FIGS. 11A and 11B, the lighting device 300 may include a body 310, a cover 330 connected to the body 310 and an end cap 350 arranged at both ends of the body 310.

A light-emitting device module 340 is connected to the bottom of the body 310 and the body 310 may be composed of a metal which exhibits superior conductivity and excellent heat release effects in order to discharge heat generated from the light-emitting device package 344 to the outside through the top of the body 310.

The light-emitting device module includes a PCB 342 and a light-emitting device package 344 including a light-emitting device (not shown). The light-emitting device package 344 is mounted on the PCB 342 in multiple colors and multiple rows to constitute an array, and may be spaced from one another by a predetermined distance or by different distances, as necessary, to control brightness. The PCB 342 may be a metal core PCB (MCPCB) or a PCB made of FR4.

The cover 330 may take the shape of a circle to surround the bottom of the body 310, without being limited thereto.

The cover 330 protects the light-emitting device module 340 from foreign substances. In addition, the cover 330 prevents glare generated from the light-emitting device package 344 and includes diffusion particles to uniformly discharge light to the outside. In addition, a prism pattern or the like may be formed on at least one of the inner and outer surfaces of the cover 330. Alternatively, a phosphor may be applied onto at least one of the inner and outer surfaces of the cover 330.

Meanwhile, the cover 330 should exhibit superior light transmittance, so that it can discharge light generated from the light-emitting device package 344 through the cover 330 to the outside, and the cover 330 should exhibit sufficient heat resistance so that it can endure heat emitted by the light-emitting device package 344. Preferably, the cover 330 is composed of a material including polyethylene terephthalate (PET), polycarbonate (PC) or polymethyl methacrylate (PMMA) and the like.

The end cap 350 is arranged on both ends of the body 310 and may be used to seal a power device (not shown). In addition, the end cap 350 is provided with a power pin 352, allowing the lighting device 300 to be applied to a conventional terminal from which a fluorescent light has been removed, without using any additional device.

Figure 12:
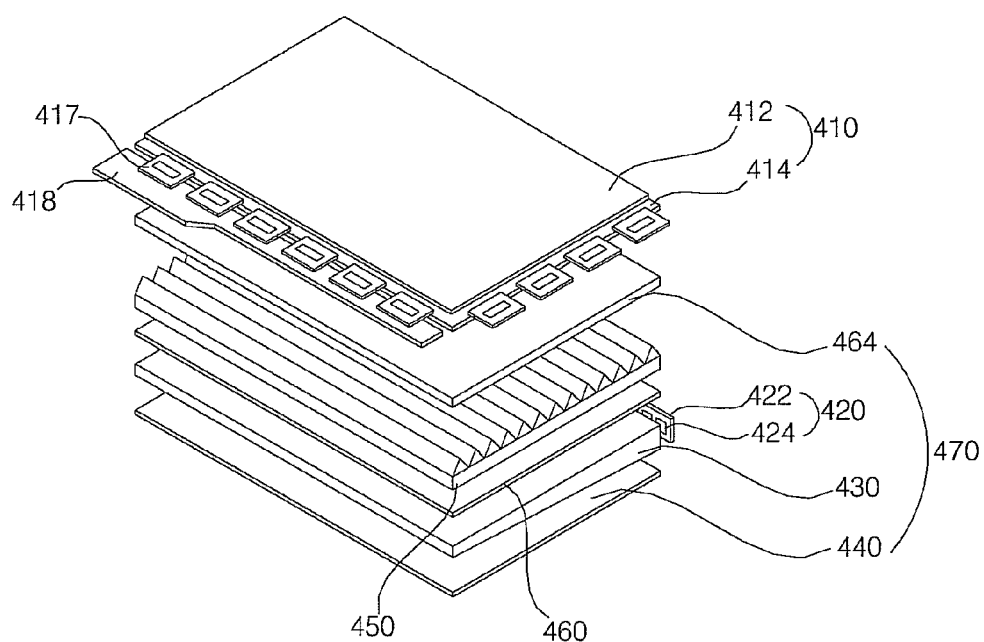
FIG. 12 is an exploded perspective view illustrating a liquid crystal display including the light-emitting device according to another embodiment.

FIG. 12 is an exploded perspective view illustrating a liquid crystal display including the light-emitting device according to another embodiment.

FIG. 12 illustrates an edge-light type liquid crystal display device 400 which includes a liquid crystal display panel 410 and a backlight unit 470 to supply light to the liquid crystal display panel 410.

The liquid crystal display panel 410 displays an image using light supplied from the backlight unit 470. The liquid crystal display panel 410 includes a color filter substrate 412 and a thin film transistor substrate 414 which face each other such that liquid crystal is interposed therebetween.

The color filter substrate 412 can realize color images to be displayed through the liquid crystal display panel 410.

The thin film transistor substrate 414 is electrically connected to a printed circuit board 718 on which a plurality of circuit components is mounted through a driving film 417. The thin film transistor substrate 414 responds to drive signals supplied from the printed circuit board 418 and may apply drive voltage from the printed circuit board 418 to liquid crystals.

The thin film transistor substrate 414 includes a thin film transistor and a pixel electrode formed as a thin film on other substrates composed of a transparent material such as glass or plastic.

The backlight unit 470 includes a light-emitting device module 420 to emit light, a light guide plate 430 to convert light emitted from the light-emitting device module 420 into a surface light source and supply the light to the liquid crystal display panel 410, a plurality of films 450, 466 and 464 to uniformize brightness of light from the light guide plate 430 and improve vertical incidence, and a reflective sheet 440 to reflect light emitted to the back of the light guide plate 430 to the light guide plate 430.

The light-emitting device module 420 includes a plurality of light-emitting device packages 424 and a PCB 422 on which the light-emitting device packages 424 are mounted to form an array.

In particular, the light-emitting device included in the light-emitting device package 424 is the same as mentioned with reference to FIG. 1.

Meanwhile, the backlight unit 470 includes a diffusion film 466 to diffuse light incident from the light guide plate 430 toward the liquid crystal display panel 410, a prism film 450 to concentrate the diffused light and thus improve vertical incidence and a protective film 464 to protect the prism film 450.

Figure 13:
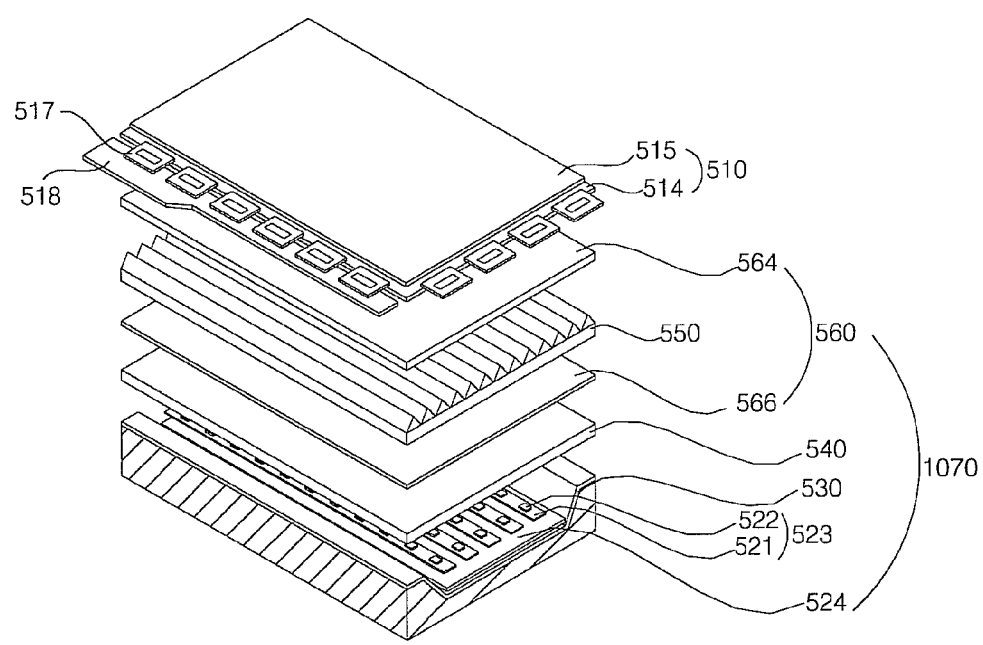
FIG. 13 is an exploded perspective view illustrating a liquid crystal display including the light-emitting device according to one embodiment.

FIG. 13 is an exploded perspective view illustrating a liquid crystal display including the light-emitting device according to one embodiment.

The contents illustrated and described in FIG. 12 are not mentioned in detail.

FIG. 13 illustrates a direct-type liquid crystal display device 500 which includes a liquid crystal display panel 510 and a backlight unit 570 to supply light to the liquid crystal display panel 510.

The liquid crystal display panel 510 has been described in FIG. 13 and a detailed explanation thereof is thus omitted.

The backlight unit 570 includes a plurality of light-emitting device modules 523, a reflective sheet 524, a lower chassis 530 in which the light-emitting device modules 523 and the reflective sheet 524 are accepted, and a diffusion plate 540 and a plurality of optical films 560 arranged on the light-emitting device modules 523.

Each light-emitting device module 523 includes a plurality of light-emitting device packages and a PCB 521 on which the light-emitting device packages 524 are mounted to form an array.

The reflective sheet 524 reflects light generated by the light-emitting device package 822 toward the liquid crystal display panel 510 to improve luminous efficacy.

Meanwhile, light emitted from the light-emitting device module 523 is incident on the diffusion plate 540 and an optical film 560 is arranged on the diffusion plate 540. The optical film 560 includes a diffusion film 566, a prism film 550 and a protective film 564.

In the embodiments, the lighting device and the backlight unit may be included in the lighting system and the present embodiments are not limited thereto.

The features, structures and effects illustrated in the above embodiments may be included in at least one embodiment, but are not limited to one embodiment. Further, those skilled in the art will appreciate that various combinations and modifications of the features, structures and effects illustrated in the respective embodiments are possible. Therefore, it will be understood that these combinations and modifications are within the scope of the embodiments.

Although the embodiments have been disclosed for illustrative purposes, those skilled in the art will appreciate that various modifications, additions and substitutions are possible, without departing from the scope and spirit of the embodiments as disclosed in the accompanying claims. For example, the respective elements described in detail in the embodiments may be modified. Further, it will be understood that differences relating to these modifications, additions and substitutions are covered by the scope of the embodiments defined in the accompanying claims.

What is claimed is:

1. A light-emitting device comprising:
a conductive support substrate;
a reflective layer on the conductive support substrate;
a first electrode layer on the reflective layer and provided with a first step in at least one region of an edge of the first electrode layer;
a protective layer on the first step, wherein the protective layer includes at least a first layer and a second layer arranged on the first layer, wherein the first layer contains silicon dioxide ($SiO_2$) and the second layer contains aluminum oxide ($Al_2O_3$);
a light-emitting structure on the first electrode layer and the protective layer, the light-emitting structure including a first conductive semiconductor layer, a second conductive semiconductor layer and an active layer interposed between the first conductive semiconductor layer and the second conductive semiconductor layer; and
an insulating layer arranged at a side of the light-emitting structure,
wherein at least one first region of the reflective layer vertically overlaps the second layer of the protective layer, and the first step of the first electrode layer vertically overlaps the second layer of the protective layer such that the first step of the first electrode layer is between the at least one first region of the reflective layer and the second layer of the protective layer, wherein a width of the second layer of the protective layer is greater than a width of the first step,
the conductive support substrate has a wider area than the first electrode layer, and
a lower side of the light-emitting structure is disposed on an upper side of the protective layer,
wherein the insulating layer extends from a top of the protective layer along the side of the light-emitting structure to a partial top of the first semiconductor layer, and
wherein the insulating layer contacts an upper side of the protective layer.

2. The light-emitting device according to claim 1, wherein the reflective layer and the first electrode layer have the same width.

3. The light-emitting device according to claim 2, wherein a width of the region where the reflective layer and the first step of the first electrode layer vertically overlap the second layer of the protective layer is 15 to 30 μm.

4. The light-emitting device according to claim 3, wherein a width of the region where the reflective layer and the first step of the first electrode layer overlap the second layer of the protective layer is 0.11- to 0.23-fold of the width of the protective layer.

5. The light-emitting device according to claim 4, further comprising:
a light extraction structure on the light-emitting structure.

6. The light-emitting device according to claim 5, wherein the light extraction structure comprises a roughness having a predetermined roughness level.

7. The light-emitting device according to claim 1, further comprising:
a second electrode layer on the light-emitting structure.

8. The light-emitting device according to claim 7, further comprising a current blocking layer under the light-emitting structure such that the current blocking layer vertically overlaps the second electrode layer in at least one region.

9. The light-emitting device according to claim 8, wherein the first electrode layer comprises a step in a region where the first electrode layer vertically overlaps the second electrode layer,
wherein the current blocking layer is in the step.

10. The light-emitting device according to claim 1, wherein the reflective layer contains at least one of Ag, Ni, Al, Rh, Pd, Ir, Ru, Mg, Zn, Pt, Au, Hf, IZO, IZTO, IAZO, IGZO, IGTO, AZO and ATO.

11. The light-emitting device according to claim 1, wherein the area of the reflective layer is larger than the area of the active layer.

12. A lighting system comprising the light-emitting device according to claim 1.

13. The light-emitting device according to claim 1, wherein the insulating layer disposed on top of the first semiconductor layer overlaps the protective layer.

14. The light-emitting device according to claim 9, wherein the current blocking layer includes a first layer and a second layer on the first layer such that the second layer is between the first layer of the current blocking layer and the first electrode layer.

15. The light-emitting device according to claim 1, wherein the first electrode layer is provided with a second step in at least one region on another edge of the first electrode layer, and the first electrode layer is a continuous layer from the first step to the second step.

16. The light-emitting device according to claim 15, wherein at least one second region of the reflective layer vertically overlaps the second layer of the protective layer, and the second step of the first electrode layer vertically overlaps the second layer of the protective layer such that the second step of the first electrode layer is between the at least one second region of the reflective layer and the second layer of the protective layer, and the reflective layer is a continuous layer from the at least one first region to the at least one second region.

* * * * *